(12) United States Patent
Winter et al.

(10) Patent No.: US 12,724,060 B2
(45) Date of Patent: Sep. 1, 2026

(54) SYSTEM AND METHOD FOR LOCATING REMOTE EARTH FAULT SECTION IN POWER GRIDS

(71) Applicant: WINTER BROTHERS AB, Kungsängen (SE)

(72) Inventors: Andreas Winter, Stockholm (SE); Johan Hollander, Järfälla (SE)

(73) Assignee: WINTER BROTHERS AB, Kungsängen (SE)

( * ) Notice: Subject to any disclaimer, the term of this patent is extended or adjusted under 35 U.S.C. 154(b) by 0 days.

(21) Appl. No.: 19/140,802

(22) PCT Filed: Nov. 8, 2023

(86) PCT No.: PCT/EP2023/081075
§ 371 (c)(1),
(2) Date: Jun. 18, 2025

(87) PCT Pub. No.: WO2024/132286
PCT Pub. Date: Jun. 27, 2024

(65) Prior Publication Data

US 2026/0056239 A1 Feb. 26, 2026

(30) Foreign Application Priority Data

Dec. 22, 2022 (EP) .................................... 22215751

(51) Int. Cl.
*H02H 3/00* (2006.01)
*G01R 31/08* (2020.01)
(Continued)

(52) U.S. Cl.
CPC ......... *G01R 31/086* (2013.01); *G01R 31/088* (2013.01); *G01R 31/52* (2020.01); *H02H 7/22* (2013.01)

(58) Field of Classification Search
CPC .................................................... G01R 31/086
See application file for complete search history.

(56) References Cited

U.S. PATENT DOCUMENTS

2006/0291113 A1* 12/2006 Altonen ............... G01R 31/088 361/42
2011/0298468 A1* 12/2011 Wahlroos .............. H02H 3/165 324/509

(Continued)

FOREIGN PATENT DOCUMENTS

CN 109541383 A 3/2019
WO 0215355 A2 2/2002

(Continued)

OTHER PUBLICATIONS

International Search Report and Written Opinion issued in corresponding PCT Application No. PCT/EP2023/081075, date mailed Jan. 31, 2024, pp. 1-13.

(Continued)

*Primary Examiner* — Stephen W Jackson
(74) *Attorney, Agent, or Firm* — Robinson & Cole LLP

(57) ABSTRACT

A system for remote locating earth fault in a multi-phase power grid powered by a power source, at least one remote detector arranged in the power grid not communicatively connected to the control unit wherein each remote detector has a unique current pattern identity. The control unit, when in a remote earth fault detection mode, is configured to adjust a voltage from the alternating voltage source with respect to the determined earth fault impedance RF and a corresponding delta angle step X to generate a zero-sequence current pattern based upon said impedance and said delta angle step X, wherein each detector is configured to identify a zero-sequence current pattern, and to determine (Continued)

which remote detector has a unique current pattern identity that corresponds to the identified current pattern.

8 Claims, 8 Drawing Sheets

(51) Int. Cl.
*G01R 31/52* (2020.01)
*H02H 7/22* (2006.01)

(56) References Cited

U.S. PATENT DOCUMENTS

2015/0346266 A1* 12/2015 Dimino ................ G01R 31/086 702/59
2020/0099220 A1 3/2020 Winter et al.
2021/0075210 A1 3/2021 Wahlroos et al.
2024/0210491 A1* 6/2024 Piesciorovsky ...... G01R 31/088

FOREIGN PATENT DOCUMENTS

WO 2014021773 A1 2/2014
WO 2017200469 A1 11/2017

OTHER PUBLICATIONS

Zang et al., "Detection and Location of Ground Faults Using a Discernible Signal," Transmission and Distribution Conference and Exhibition: Asia and Pacific, Jan. 1, 2005, pp. 1-4.
Xue Jingrun et al., "Zero Sequence Admittance based Fault Location in Low Resistance Grounding Distribution System," 2018 2nd IEEE Conference on Energy Internet and Energy System Integration, Oct. 20, 2018, pp. 1-4.

* cited by examiner

SYSTEM AND METHOD FOR LOCATING REMOTE EARTH FAULT SECTION IN POWER GRIDS

CROSS-REFERENCE TO RELATED APPLICATIONS

The instant application is a U.S. National Stage application of and claims priority to PCT/EP2023/081075, filed on Nov. 8, 2023, which is a PCT application of and claims priority to EP Application No. 22215751.3, filed on Dec. 22, 2022, now EP 4390411 B1, granted Sep. 17, 2025, the subject matter of both aforementioned applications is hereby incorporated by reference in their entireties.

BACKGROUND OF THE INVENTION AND PRIOR ART

The present disclosure relates to the detection, compensation, and locating of earth fault currents in a multiphase power grid. The present invention is based upon the technology described in WO2017/200469 that relates to locating of the faulty feeder containing the earth fault using communicatively connected detectors.

More particularly, the present invention relates to a system and a method for earth fault locating down to the faulted feeder section without the need of communicatively connected remote detectors, and without the need of measuring admittance $Y_0$, but only measuring current $I_0$, by applying the system and method defined by the independent claims. The present invention also relates to a computer program and a process-readable medium.

There are today technical solutions aiming to locate earth faults down to the faulty feeder section without communicatively connected passive detectors. However, the problem with these known solutions is the limitation of detection sensitivity. Low-Ohm earth faults can be detected but high-Ohm earth faults cannot be reliably detected because the measured current is too small. By high-Ohm faults may be earth faults with up to 25 kOhm or higher impedance.

Once a faulty section has been disconnected by the detector the main system needs to retune a zero-point reactor to match the size of the "new network". This scheme is part of the system and described in the method.

WO2014/021773 discloses a solution in which a controllable grounding transducer is arranged to compensate for a residual operating current in a grounding fault of an alternating voltage power supply network with a power supply transformer. A primary winding of the grounding transformer is coupled to the power grid and a secondary coil of the grounding transformer is coupled between a zero point of the power grid and ground, the grounding transformer comprising two or more winding couplers and a control unit which via the winding couplers controls the secondary voltages of the grounding transformer with amplitudes and phase angles relative to the voltage signal of the power supply transformer.

WO02/15355 relates to a method and device for selectively localizing high-ohm, single-pole earth faults in neutral-point compensated electric supply networks.

Problem with Previously Known Techniques

By applying the solution described in WO2017/200469 it is possible to locate the faulted feeder containing the earth fault with highest possible sensitivity using communicatively connected detectors.

A feeder is usually divided into several sections and can be connected or disconnected using a breaker. It is desirable to determine in which section the earth fault is, using a detector at the location of the breaker.

Existing techniques using non-communicatively connected passive fault passage indicators attempt to identify this, but suffer in sensitivity and does not work reliably on high-Ohm earth faults.

Although the technology disclosed in WO2017/200469 has proven excellent performance, there is still room for improvements. A limitation of the technology of WO2017/200469 is not regarding limited detection sensitivity, but limited to, the need of measuring both $U_0$ voltage and $I_0$ current, thus calculating the zero-sequence admittance $Y_0$ that requires measuring $U_0$ voltage which is usually not available in remote locations. In remote areas, communication as well as $U_0$ voltage measurement are usually not available, and therefore another solution is required.

SUMMARY OF THE INVENTION

The main object of the present invention is to solve the problem of high impedance earth fault locating, down to the faulty feeder section in a multiphase power grid, and not requiring $U_0$ voltage measurements, and not having access to communication. This must be achieved by keeping the earth fault current below a certain value of e.g., 0.5 A, in order to reduce the risk of the earth fault results in a fire.

The above object is achieved by the system and method defined in the independent claims. Preferred embodiments are set forth in the dependent claims.

Thus, one challenge is to be able to achieve this without having a communication between the control unit 370 and the remote detector(s). The system and method according to the present invention solves this problem. The system and method according to the present invention makes it possible to achieve this by only reading $I_0$ current from already available current sensors installed close to the breakers in the network, where $U_0$ voltage measurement is usually not available. In addition, the system and method according to the present invention also solves the problem to retune the zero-point reactor once parts of the network have been tripped by the detector(s).

This is beneficial for several reasons. One important reason is safety, as the detector can detect any type of earth fault and disconnect the faulty section using the existing breakers. This reduces the risk of starting a fire, damaging equipment, and increasing personal safety. Another reason is that only a minimum section of the network is disconnected resulting in that least number of customers gets affected by a power outage. And still another reason is that minimum outage time is required, since the earth fault has been located down to the faulty feeder section.

To be able to achieve the above object, the central control unit must perform several steps, which will be described in the detailed description, e.g., by the flow chart in FIGS. 8 and 9. Action of the control unit is required for the remote detectors to being able to detect the specific current pattern.

According to the present invention, the control unit first needs to detect the earth fault impedance using its central detectors in the substation, using the method described in WO2017/200469. The earth fault impedance determines a delta angle step to be used for so-called fault passage indicator (FPI) localization. On low impedance faults, only a small delta step is required to detect a fault whilst on a high impedance fault a much larger delta step is required to achieve large enough (but below a predetermined current threshold, preferably approximately 0.5 A) earth fault current. Once the earth fault impedance has been determined, a corresponding angle delta has been determined by the control unit, to be used for the remote detector earth fault locating.

In a remote detector earth fault detection mode, the control unit is configured to first determine the size of the phase angle step based on the earth fault impedance. The size of the phase angle step is then controlled on and off according to a pre-determined pattern in terms of timing and number of executions. The remote detectors in the earth fault current path, as shown in FIGS. 6 and 7, can detect the pattern. In a symmetrical multiphase system, when only altering the phase angle of the central controller in neutral of the transformer, a $\Delta I_0$ current will be measured, but only by the remote detectors in the earth fault current path. If amplitude is changed, a $\Delta I_0$ current will be detected by all remote detectors—which is not desirable. This is an important aspect of the present invention, since the amplitude can be changed for other purposes than this, the pre-determined remote detector earth fault locating current pattern must be decided in a way, not to be confused with other actions in the network.

This system is advantageous because it makes it possible to find a fault location without risking exceeding a maximum power current at the fault location. It is unproblematic to allow the control unit to adjust the voltage of the alternating voltage source so that its output current in the fault detection mode is lower than a certain predetermined current threshold, e.g., approximately 0.5 A. This current is the limit of post-localization of earth fault in the areas of Australia and USA that is particularly sensitive to forest or grass fires.

According to this aspect of the invention, the control unit is configured to switch to the fault compensation mode after fault detection mode. Consequently, power transmission via the malfunctioning device part can continue until the exact location of the fault location has been established and the necessary resources for repairing the fault have been developed.

According to a further aspect of the invention, the object is achieved by a software program which is loadable to the memory of at least one processor, wherein the computer program comprises software for executing the above suggested method when the computer program is running in the at least one processor.

According to another aspect of the invention, the object is achieved by a computer readable medium having a program stored therein, the program being configured to cause at least one processor to execute the above suggested method when the program is loaded in the at least one processor.

Further advantages, advantageous features and applications of the present invention will be apparent from the following description and the dependent claims.

BRIEF DESCRIPTION OF THE DRAWINGS

The invention will now be explained in more detail by means of embodiments, which are shown by way of example, with reference to the accompanying drawings.

DESCRIPTION OF PREFERRED EMBODIMENTS OF THE INVENTION

Figure 1:
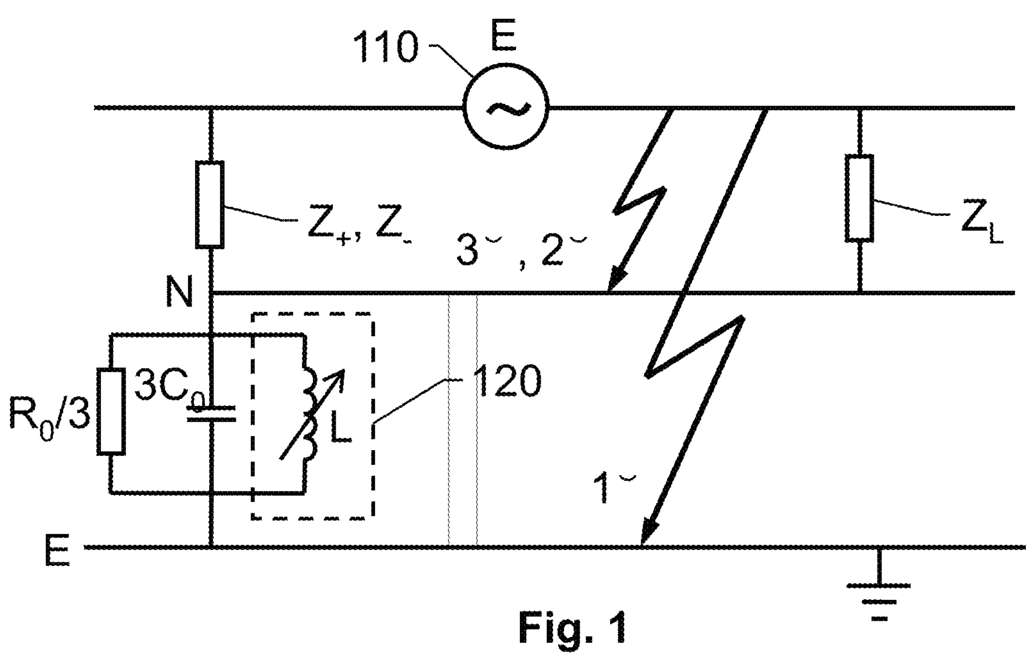
FIG. 1 illustrates a first prior art solution for resonance grounding.

Initially, reference is made to FIG. 1, which illustrates a first-mentioned known solution for so-called resonance grounding in a multi-phase power grid. FIG. 1 shows a transformation of the power grid to its symmetric component. The power grid here includes a power source 110 which supplies a driving voltage E to the power grid and source impedances $Z_+$, $Z_-$ and $Z_0$ and also a payload $Z_L$ in the power grid.

If earth fault occurs in the form of a single-phase grounding 1Ø the fault current can be reduced by means of a zero-point reactor 120 connected between the zero-point N and the ground E. The zero-point reactor 120 is a variable inductance L which forms a parallel resonance circuit with the capacitance leakage current $3C_0$ of the power grid. On the one hand, transfer of the payload $Z_L$ must be limited to a plus- and minus-sequence system, that is, between the faults; and on the other hand, the zero-point reactor 120 must be capable of matching the varying leakage currents that occur in the power grid during operation.

The basic prerequisite for limiting the power transmission to the plus sequence and the minus sequence is given in the vast majority of existing power grids. Resonance grounding is today the predominant system of the existing high-voltage distribution networks.

An immediate effect of current limitation at single phase landings 1Ø is that light arc overlays, which are the most frequent errors in overhead line network, are self-sealed. The zero-point reactor 120 is therefore also called extinguishing coil, or Petersen coil after inventor Waldemar Petersen.

At ground fault, zero-point reactor 120 compensates for the capacitive leakage currents. The resistive leakage currents remain without compensation, and the resistive leakage currents usually represent 5-10% of the total earth fault current.

As more and more overhead line networks are replaced by buried cables, the capacitive leakage currents of the power grid generally increase. This also increases resistive leakage currents in power grids. As a consequence, the uncompensated resistive residual currents also increase, which in turn risks exposing the self-extinguishing function in that part of the power grid that still includes overhead line networks. For security reasons, this is of course unacceptable.

Figure 2:
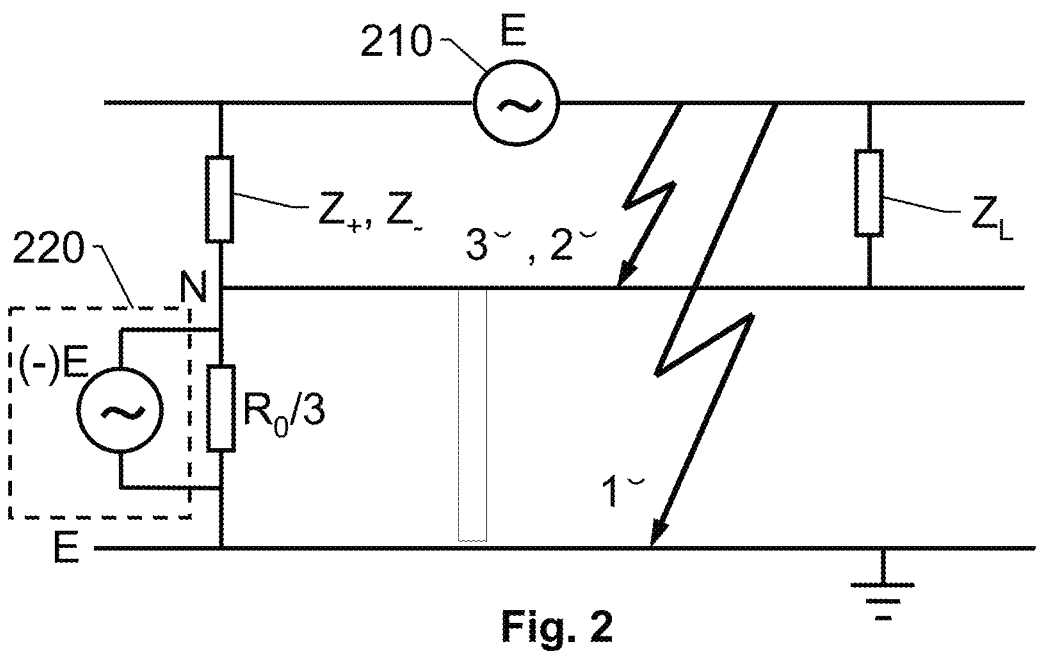
FIG. 2 illustrates a second prior art residual current compensation solution.

FIG. 2 illustrates a second prior art solution for residual current compensation, which is a further development of the structure of FIG. 1. The now tuned parallel resonance circuit $3C_0/L$ has here been omitted for the sake of clarity.

In analogy with FIG. 1, FIG. 2 shows a driving voltage E from a power source 210, source impedances $Z_+$, $Z_-$ and $Z_0$ and a payload $Z_L$. In addition, a residual current compensation device 220 is included, which in turn includes a voltage source (−)E which is synchronized with the power grid, which injects a compensation current between the zero point and ground of the power grid, which compensating current is equal to the residual current, but phase distorted 180° relative to a phase angle of the residual current. The voltage source (−)E of the residual current compensation device 220 is parallel to the sum of the resistive currents $R_0/3$ of the power grid. Then, as mentioned above, the known solutions do not allow a localization of a fault location during residual current compensation while meeting the regulatory requirements for maximum current strength, the invention aims at solving this problem.

Figure 3:
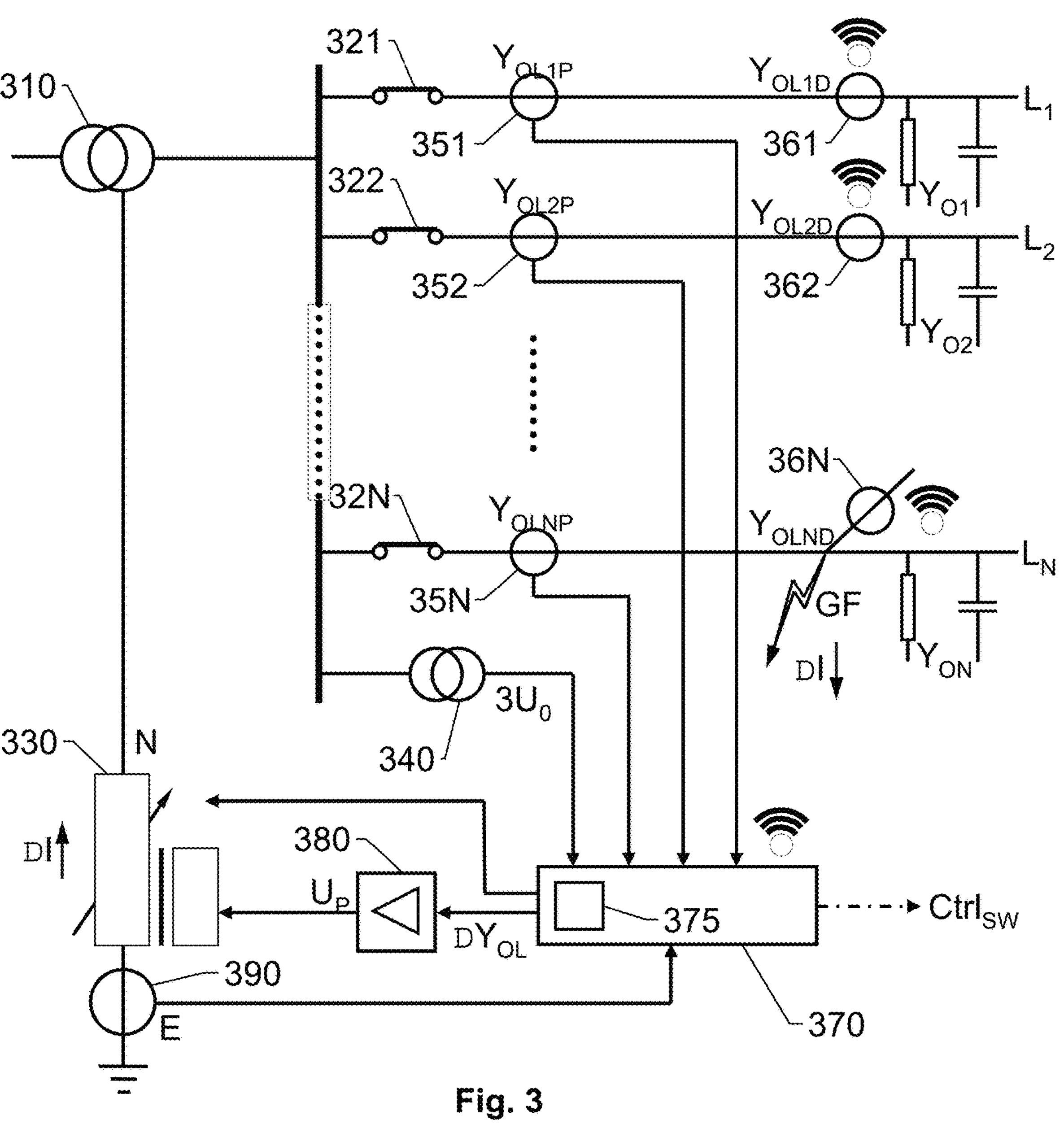
FIG. 3 shows a single-line diagram of a system for locating earth fault disclosed in WO2017/200469.

FIG. 3 shows a prior art system according to WO-2017/200469, specifically a single-line diagram for locating earth fault in a multi-phase power grid.

In general terms, the therein disclosed methodology assumes that once an error has been detected and the earth fault current has been compensated according to the above described with reference to FIG. 2, the voltage/current of the assumed fault location gradually increases while appropriate parameters are measured in the power grid. In this fault detection mode, the same alternating voltage source is used, which is used for residual current compensation in a fault current compensation mode.

More specifically, in the fault detection mode, a fault localization signal is superimposed by means of the power supply (−)E for residual current compensation. A relationship between current and voltage in the fault location is determined by an initially unknown fault impedance, together with a source impedance of a fault circuit. In order to ensure that the current resulting from the localization signal does not exceed given limits, the voltage of the localization signal is gradually increased until the fault location is determined by means of specifically adapted detectors, alternatively until a maximum voltage level has been achieved, whichever occurs first.

FIG. 3 shows a multiphase power grid that is fed by a power source 310. The prior art system comprises a power grid synchronized alternating voltage source 380 which is connected between a zero-point N of the grid and ground E.

The system also includes a control unit 370 which is capable of controlling the alternating voltage source 380 in a fault current compensation mode to compensate for any ground fault current ΔI in a resonance grounded power grid to a value underlying a threshold level. Further, a three-phase measurement transformer 340 is connected to the controller 370, which three-phase measurement transformer 340 is configured to measure a zero-sequence voltage $3U_0$ to determine if ground fault exists in the power grid.

The system further includes at least one detector, here exemplified by 351, 352, 35N, 361, 362 and 36N, which detector is arranged in the power grid and communicatively connected to the control unit 370. The at least one detector 351, 352 35N, 361, 362 and/or 36N are further configured to register the measurement values $Y_{OL1P}$, $Y_{OL1D}$, $Y_{OL2P}$, $Y_{OL2D}$, $Y_{OLNP}$, and $Y_{OLND}$ representing zero-sequence current and zero-sequence admittance, so that these parameters can be reported to the control unit 370.

During current residual current compensation, the fault detection mode can be activated automatically, or in response to a command to the control unit 370, which command has been generated by an operator of the power grid.

In the fault detection mode, the control unit 370 is configured to progressively adjust an output voltage $U_P$ from the alternating voltage source 380 with respect to amplitude and/or phase angle so that a zero-sequence current and/or a zero-sequence admittance between alternating voltage source 380 and a possible fault location changes.

The at least one of the detectors 351, 352, 35N, 361, 362 and/or 36N registers the measurement values $Y_{OL1P}$, $Y_{OL1D}$, $Y_{OL2P}$, $Y_{OL2D}$, $Y_{OLNP}$ and $Y_{OLND}$ representing zero-sequence current and/or zero-sequence admittance and transfers these measurement values $Y_{OL1P}$, $Y_{OL1D}$, $Y_{OL2P}$, $Y_{OL2D}$, $Y_{OLNP}$, and $Y_{OLND}$ to the control unit 370.

In the fault detection mode, the control unit 370 is configured to localize a ground fault GF based on at least one of the measured values $Y_{OL1P}$, $Y_{OL1D}$, $Y_{OL2P}$, $Y_{OL2D}$, $Y_{OLNP}$, and $Y_{OLND}$ representing zero-sequence current and/or zero-sequence admittance from the at least one detector 351, 352, 35N, 361, 362 and/or 36N. At the same time, by measuring a current in a grounding 390 of a zero-point reactor 330, the control unit 370 checks that a change of current ΔI does not exceed a maximum allowable level.

The control unit 370 is configured to switch to fault compensation mode after the fault detection mode has ended if a ground fault GF has been located. Alternatively, the associated branch conductor line, such as $L_N$ in FIG. 3, may be disconnected from the power source 310. In FIG. 3 is shown current selector 321, 322 and 32N, which are arranged on a respective line $L_1$, $L_2$ and $L_N$, and are individually controllable from control unit 370 on the basis of a control signal $CtrI_{SW}$.

If no earth fault is detected, the control unit 370 is configured to disconnect the alternating voltage source 380.

According to a variation of the known system, the control unit 370 in the fault detection mode is configured to control the alternating voltage source 380 to output an alternating voltage to the power grid, which (i) are superimposed the voltage of the power grid, (ii) is gradually changing and (iii) whose frequency differs from a frequency of the power grid. Accordingly, detection of the signal is facilitated by the at least one detector 351, 352, 35N, 361, 362 and/or 36N.

Particularly preferred is whether the control unit 370 is configured to control the alternating voltage source 380 to output an alternating voltage to the power grid with a superimposed signal pattern, and the at least one detector 351, 352, 35N, 361, 362 and/or 36N is specifically configured to detect this superimposed signal pattern.

Generally, the control unit 370 is configured to operate the above described procedure in a completely automatic manner, for example by executing a computer program in a processor. Therefore, the control unit 370 advantageously includes a memory device 375 which stores a computer program including software for executing the procedure when the program is running in the processor.

The present invention is closely related to, and based upon, the system and the method disclosed in WO2017/200469, and the same or similar thermology is applied herein as in WO2017/200469.

Figure 4:
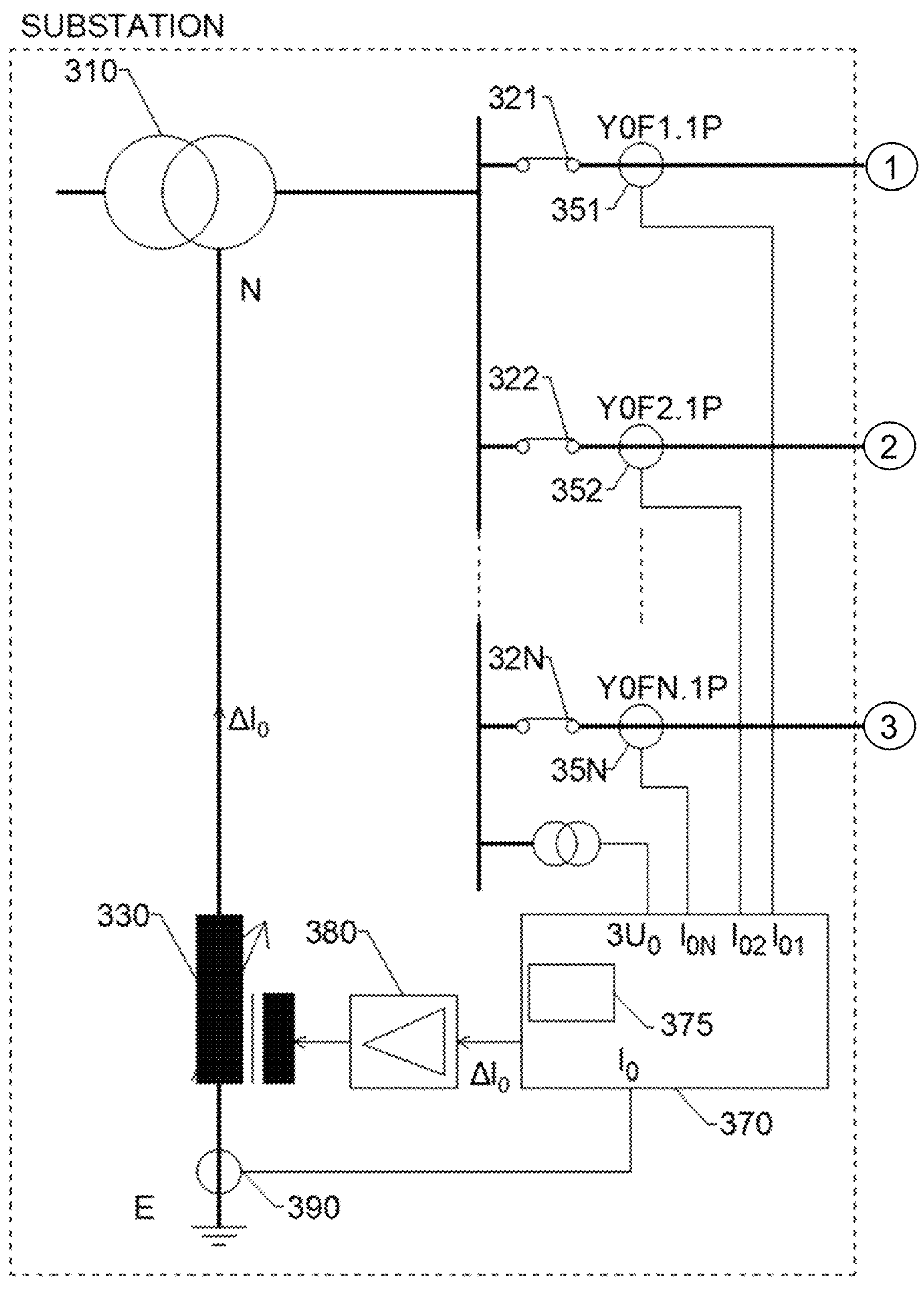
FIGS. 4 and 5 show a single-line diagram of a system for locating earth fault according to the present invention.
Figure 5:
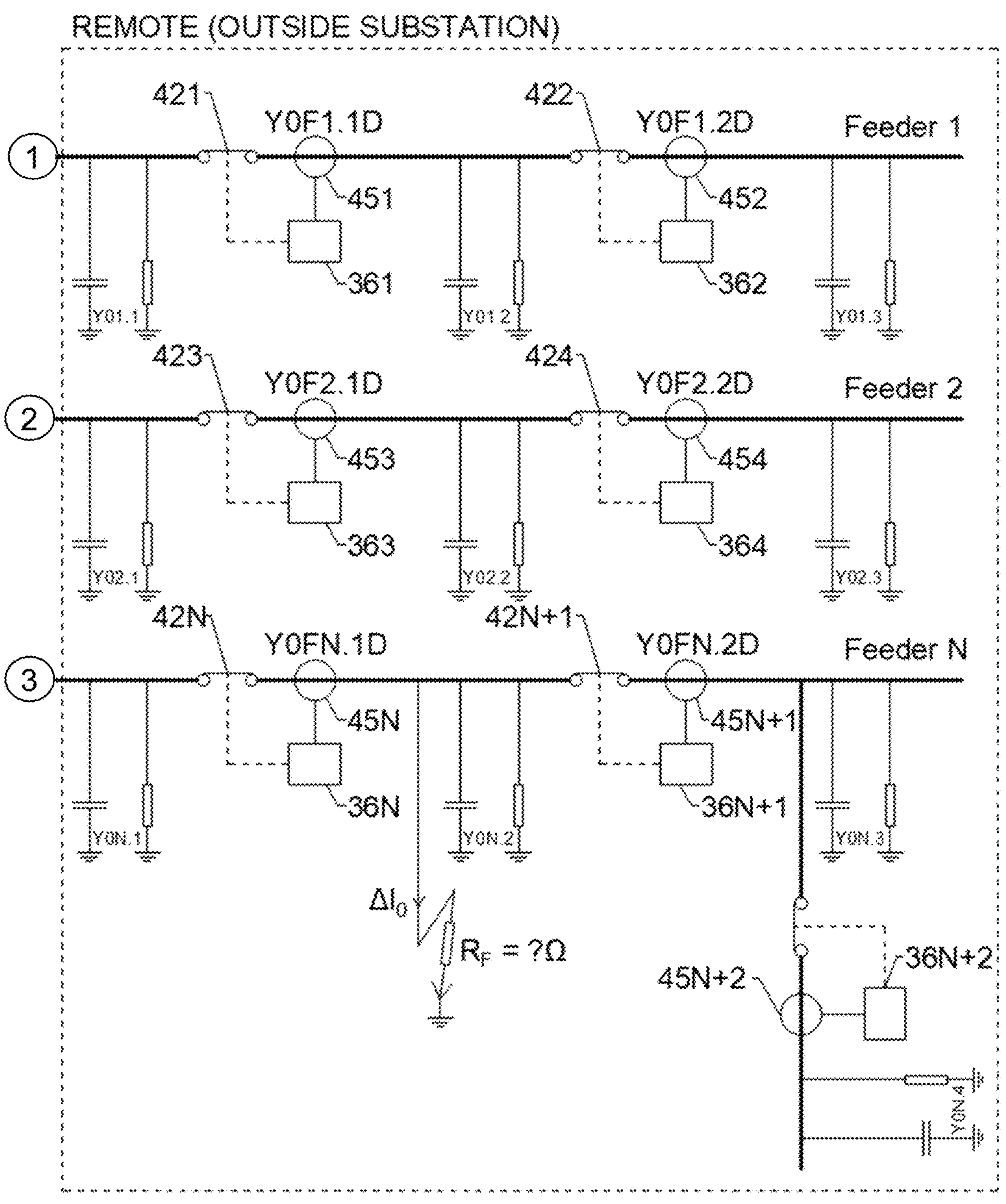

FIGS. 4 and 5 show a single-line diagram of a system for locating earth fault according to the present invention. FIG. 4 illustrates the structure of the substation of the system and FIG. 5 illustrates the remote part of the structure, where encircled digits 1-3 indicate connection points between the respective structures. FIGS. 4 and 5 will now be described in detail. However, some items of the structures shown in FIGS. 4 and 5 have already been described above in connection with FIG. 3, and will therefore not be described again.

Thus, the present invention relates to a system for locating earth fault in a multi-phase power grid powered by a power source 310. The system comprises an alternating voltage source 380 synchronized with the power grid, and which is connected between a zero point (N) of the power grid and earth (E), and a control unit 370 configured to control the alternating voltage source 380 in a fault current compensation mode to compensate for any ground fault current in the power network to a value below a threshold level. The system comprises at least one detector 351, 352, 35N arranged in the power grid and communicatively connected to the control unit 370, which at least one detector 351, 352, 35N is configured to register measurement values representing zero-sequence current and zero-sequence admittance. The control unit 370, when in a fault detection mode, is configured to gradually adjust a voltage from the alternating voltage source 310 with respect to amplitude and/or phase angle so that a change of zero-sequence current and zero-sequence admittance between the alternating voltage source 370 and a localization point can be measured by the at least one detector 351, 352, 35N. The at least one detector 351, 352, 35N is configured to apply registered measured values representing zero-sequence current and/or zero-sequence admittance to the control unit 370. When the control unit 370 is in the fault detection mode, it is configured to localize a ground fault based on at least one of the measurement values representing changes of zero-sequence current and/or zero-sequence admittance, wherein the control unit 370 is configured to switch to the fault compensation mode after the fault detection mode.

The at least one detector 351, 352, 35N is also configured to register measurement values to be applied by the control unit 370 to determine an earth fault impedance $R_F$ and a corresponding delta angle step X. The system further comprises at least one remote detector 361, 362, 363, 364, 36N, 36N+1, 36N+2 arranged in the power grid not communicatively connected to the control unit 370. Each at least one remote detector has a unique current pattern identity. The remote detectors have identities related to how many remote detectors are installed on a specific feeder. One current pattern detection triggers remote detector with identity ID1, two current pattern detections triggers ID2, and N current pattern detections triggers IDN.

The control unit 370, when in a remote earth fault detection mode, is configured to adjust a voltage from the alternating voltage source 380 with respect to the determined earth fault impedance $R_F$ and a corresponding delta angle step X to generate a zero-sequence current pattern based upon the impedance and the delta angle step X. Furthermore, each at least one detector 361, 362, 363, 364, 36N, 36N+1, 36N+2 is configured to identify a zero-sequence current pattern, and to determine which remote detector has a unique current pattern identity that corresponds to the identified current pattern. Preferably, the determined remote detector is then configured to disconnect a faulty section associated to the determined remote detector, by applying a breaker 421, 422, 423, 424, 42N, 42N+1 associated to the determined remote detector.

According to one embodiment, after disconnection of a faulty section, the control unit 370 is configured to control a zero-point reactor 330 to retune in order to match the adjusted network size and to continue the fault current compensation mode to compensate for any ground fault current in the power network to a value below a threshold level.

Thus, the determined earth fault impedance $R_F$ and the corresponding delta angle step X are those required by the alternating voltage source 380 to result in a large enough delta $I_0$ current for the detectors to detect and still meet the requirement not to exceed e.g., 0.5 A and hence not start a fire during the remote earth fault locating process.

Figure 6:
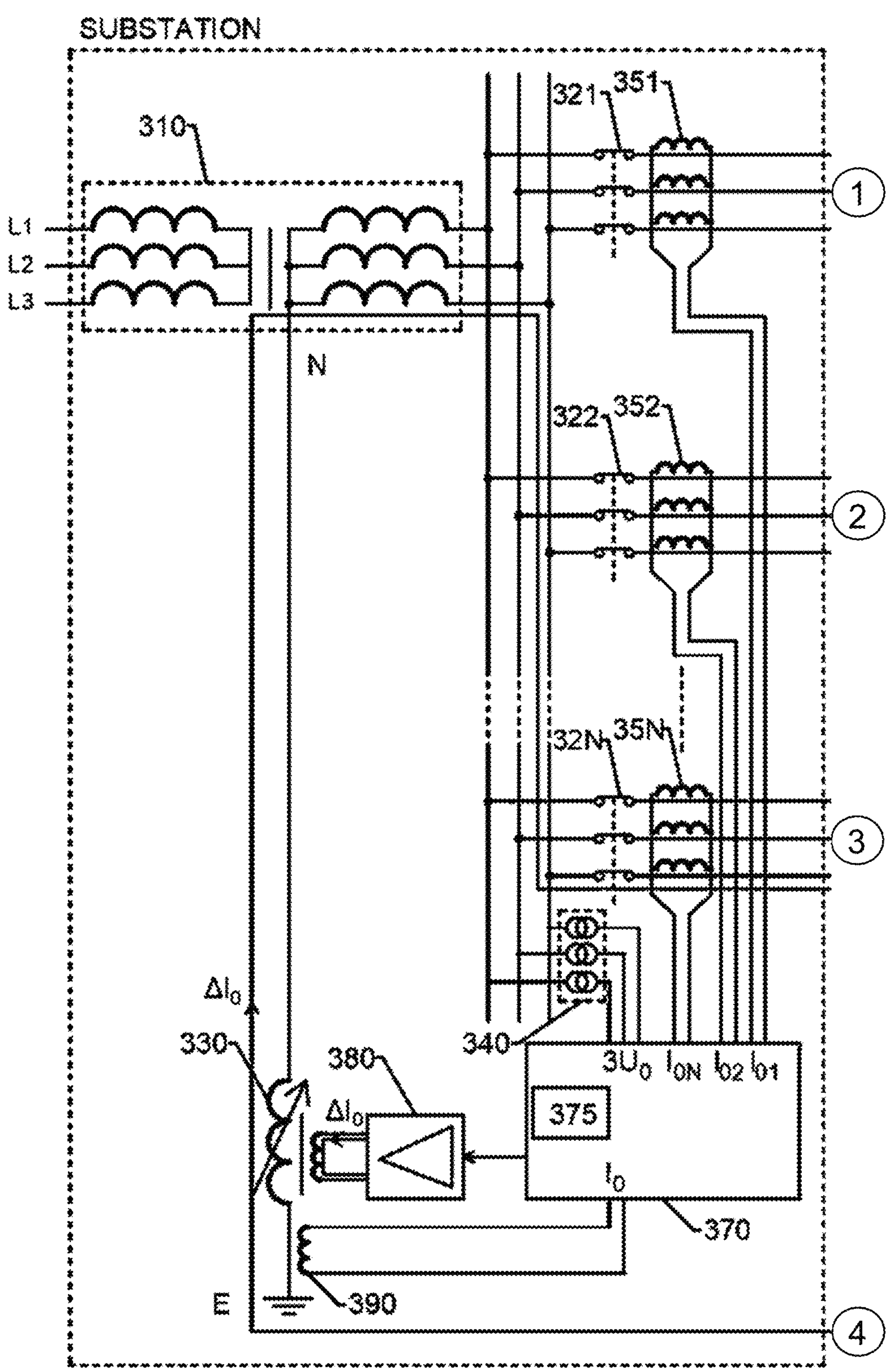
FIGS. 6 and 7 illustrate the structure of a typical multiphase resonance grounded system with local and remote detectors where the present invention is applied.
Figure 7:
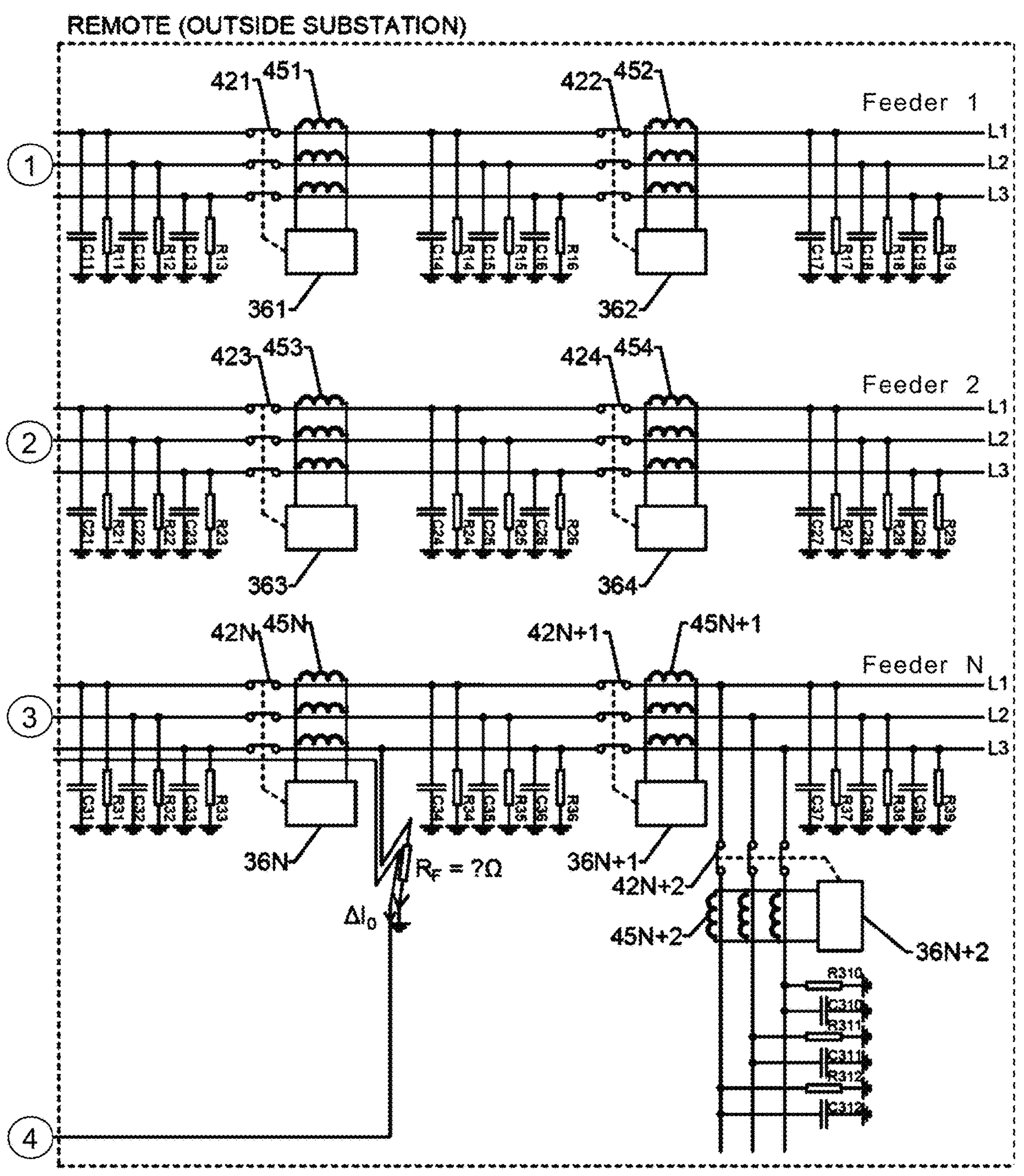

FIGS. 6 and 7 illustrate a detailed structure of a typical multiphase resonance grounded power grid where the present invention is be applied. FIG. 6 illustrates the structure of the substation of the system and FIG. 7 illustrates the remote part of the structure, where encircled digits 1-4 indicate connection points between the respective structures.

In a power grid, natural coupling in each phase as shown by C and R exist and the size of these grows with distance (size of the grid).

It is required that the network is symmetrical, meaning the sum of all coupling elements to ground on Feeder 1 are essentially equal. Thus, (C11+C14+C17)=(C12+C15+C18)=(C13+C16+C19) and (R11+R14+R17)=(R12+R15+R18)=(R13+R16+R19).

Coupling elements to ground on Feeder 2 are essentially equal. Thus, (C21+C24+C27)=(C22+C25+C28)=(C23+C26+C29) and (R21+R24+R27)=(R22+R25+R28)=(R23+R26+R29).

And, coupling elements to ground on Feeder N are essentially equal.

Thus, (C31+C34+C37+C312)=(C32+C35+C38+C311)=(C33+C36+C39+C310) and (R31+R34+R37+R312)=(R32+R35+R38+R311)=(R33+R36+R39+R310).

If an earth fault occurs in the form of a single-phase grounding at the location of $R_F$ the earth fault current path is illustrated by the line designated by $\Delta I_0$, that runs throughout the network.

An immediate effect of current limitation at single phase grounding is that the earth fault current through the resistor $R_F$ is limited to close to 0 by the control unit, since the voltage of phase L3 will be controlled to be as close to 0 as possible.

When the network is in earth fault mode, all detectors in the network will measure $I_0$ current with size determined by the network size, determined by the sum of all capacitors (C11-C312) and resistors (R11-R312) connected to the feeder where the detector is connected. Further out in the network the size of the $I_0$ current will decrease since the network size "behind" the detector will become smaller. Measuring $I_0$ current above a specific threshold is not a criterion for the earth fault being located.

Once an error has been detected by the control unit 370 and the earth fault current has been compensated, the voltage/current of the assumed fault location gradually increases which is achieved by the system disclosed above, and in accordance with the disclosure of WO 2017/200469, while appropriate parameters are measured in the power grid. In this fault detection mode, the same alternating voltage source is used, which is used for residual current compensation in a fault current compensation mode.

Once the gradual increase has been performed during fault detection mode, the earth fault impedance is known, and the required delta phase X degrees are known to be applied in a remote detector earth fault mode that will follow.

In a remote detector earth fault mode according to the present invention, a current pattern is created by the control unit 370, controlling the variable power source 380 of X degrees (delta) (duration XXXms), 0 degrees (delta) (duration XXXms), X degrees (delta) (duration XXXms), 0 degrees (delta) (duration XXXms). By creating this pattern, also known by all remote detectors, the earth fault current path can be determined. In one variation the duration XXX is 500 ms, but may naturally be set to other values, preferably in the range of 100-1000 ms.

Each remote detector 361, 362, 363, 364,36N, 36N+1, 36N+2 has a unique current pattern identity. In addition, each remote detector is also provided with a breaker 421, 422, 423, 424, 42N, 42N+1 used to disconnect the faulty section associated to the remote detector.

In the illustrated situation, only the detectors in the current path will detect ΔIo current when the angle is changed by the main controller 380 in the remote earth fault locating mode.

The reason is because all feeders are symmetrical, with respect to equal coupling elements to ground, and in the illustrated situation, the faulty feeder is no longer equal with respect to coupling level to ground. (C31+C34+C37+C312)=(C32+C35+C38+C311)=(C33+C36+C39+C310) but (R31+R34+R37+R312)=(R32+R35+R38+R311)≠(R33+R36+R39+R310+RF).

If one feeder contains multiple remote detectors and the earth fault is furthest out on that feeder, all detectors will measure the earth fault path and indicate the fault. In order to not trip all remote detectors, the current pattern can be repeated so that remote detector with ID1 36N+2 is triggered by the first current pattern detection, detector with ID2 36N+1 is detected by the second current pattern detection and detector with ID3 36N is triggered by the third current pattern detection.

During current residual current compensation, the fault detection mode may be activated automatically, or in response to a command to the control unit 370, which command has been generated by an operator of the power grid.

In the fault detection mode, the control unit 370 is configured to progressively adjust an output voltage UP from the alternating voltage source 380 with respect to amplitude and/or phase angle so that a zero-sequence current and/or a zero-sequence admittance between alternating voltage source 380 and a possible fault location changes.

In the remote earth fault detection mode, the control unit 370 is configured to use the phase angle determined in fault detection mode and re-use this output for remote earth fault detection. The at least one of the detectors 361, 362, 363, 364, 36N, 36N+1 and 36N+2 looks for the current pattern in $I_0$ current and once detected, a signal to the corresponding breaker (ACR) (421, 422, 423, 424, 42N, 42N+1, 42N+2) can be sent to trip the faulty section of the network.

If a section is disconnected during the earth fault the central controller 370 must be able to detect this by measurement of the $I_0$ sum of all its central detectors. If the $I_0$ sum changes during the earth fault the zero-point reactor 330 must be tuned to match the new size of the entire network. The $\Delta I_0$ can be translated directly to control of $\Delta I$ to zero-point reactor 330.

If no earth fault is detected, the control unit 370 is preferably configured to disconnect the alternating voltage source 380.

It is generally preferred that the control unit 370 is configured to operate the above described procedure in a completely automatic manner, for example by executing a computer program in a processor. Therefore, the control unit 370 advantageously includes a memory device 375 which stores a computer program including software for executing the procedure when the program is running in the processor.

Figure 8:
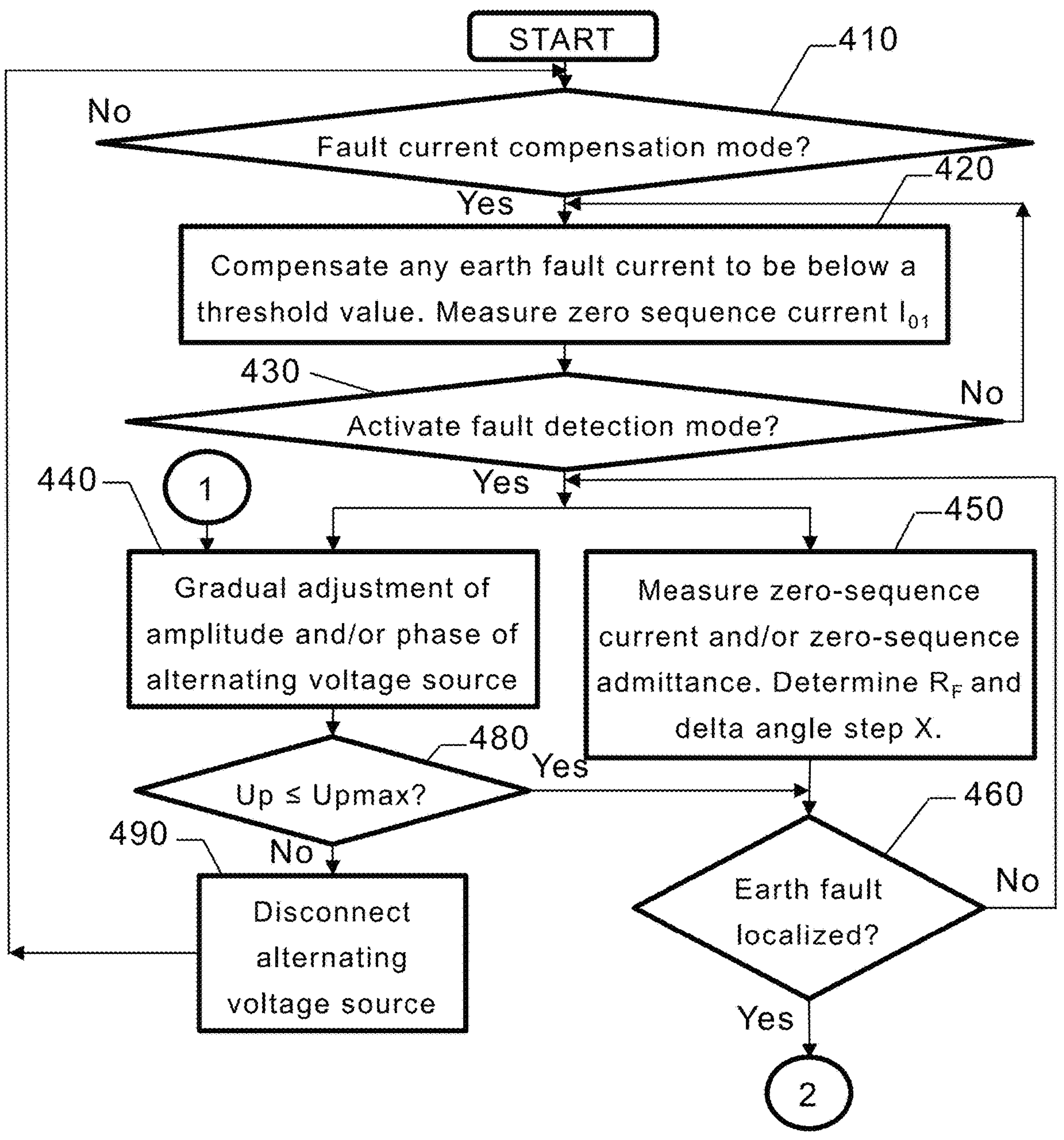
FIGS. 8 and 9 illustrate by means of a flowchart, a method according to an embodiment of the invention.
Figure 9:
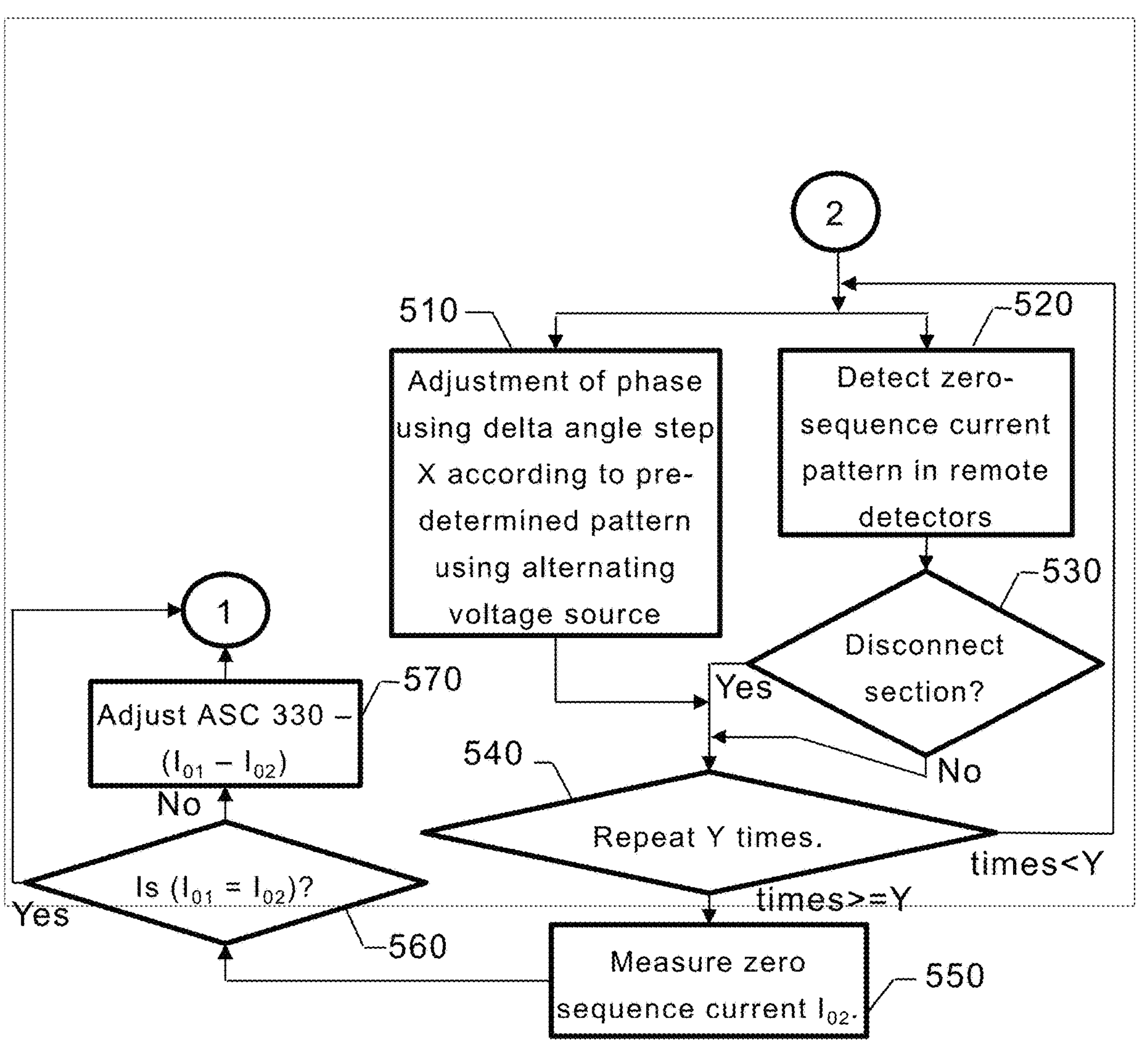

In order to summarize, and with reference to the flowcharts of FIGS. 8 and 9, we will now describe an embodiment of the method according to the present invention.

In a first step 410, it is examined if a fault current compensation mode is to be applied. If this is not the case, the procedure loops and stops at step 410. If in step 410 an earth fault has been detected, a step 420 follows in which compensation is made for an earth fault current so that the earth fault current is below a threshold. In step 420 the $I_{01}$ current sum of all local detectors is added and stored to be used later. Then a step 430 follows.

In step 430, it is checked if a fault detection mode is to be activated. If this is not the case, the procedure loops back to step 420 for continued compensation of ground fault current.

If, at step 430, it is determined that the fault detection mode is to be activated, steps 440 and 450 are activated, preferably parallel to each other.

In step 440, the alternating voltage source is controlled to gradually adjust an output voltage from the alternating voltage source with respect to amplitude and phase angle to result in a zero-sequence current and zero-sequence admittance between the alternating voltage source and a fault location is changed.

In step 450, a zero-sequence current and/or a zero-sequence admittance between the alternating voltage source and the fault location is measured by means of specifically adapted detectors communicatively connected to the control unit. $R_F$ and delta angle step X are determined and will be used for remote earth fault locating.

After step 440, a step 480 follows, where it is checked whether the output voltage $U_P$ from the alternating voltage source is lower than or equal to a maximum allowed value $U_{Pmax}$. If so, the procedure proceeds to a step 460, and otherwise a step 490 follows.

At step 490, the alternating voltage source is disconnected. Then the procedure returns to step 410.

After step 450 follows a step 460 where it is investigated if a ground fault has been detected by the measurements in step 450. If so, steps 510 and 520 follows and are executed in parallel, and otherwise the loop proceeds back to steps 440 and 450 for continued fault localization.

The above part of the method essentially corresponds to the method disclosed in WO2017/200469. One important difference is in step 450, where $R_F$ and delta angle step X are determined.

In step 510 (see FIG. 6) the alternating voltage source is controlled in fixed angle steps as previously determined in step 450. The delta angle step X is used to create a pre-determined current pattern to be detected by the remote detectors.

In step 520, the remote detectors are configured to look for the current pattern generated by the alternating voltage source.

In step 530 it is determined whether the faulty section shall be tripped or not. Depending on how many times the current pattern is detected, the remote detector determines to trip the breaker (ACR) or not.

In step 540 the control unit 370 can repeat step 520 if the number of installed remote detectors on the faulty feeder exceeds 1. Otherwise, the control unit moves on to step 550.

At step 550 $I_{02}$ current sum of all local detectors is measured. Step 560 follows.

At step 560 $I_{01}$ and $I_{02}$ are compared. If the $I_{02}$ current is smaller than $I_{01}$ this means that a section was disconnected in the network.

At step 570 the zero-point reactor 330 is tuned to match the new network size. If a large section was tripped, this means that the earth fault compensation may go into overload and step 440 cannot be repeated. After this step, step 440 is repeated until the earth fault has been cleared.

The above described steps, as well as any random sequence thereof described with reference to FIGS. 8 and 9 may be controlled by a programmed processor. In addition, although the above-described embodiments of the invention, with reference to the figures, comprise a computer and computer-implemented processes, the invention extends to particularly, on a carrier or in a carrier, being adapted to practically implement the invention. The program may be in the form of source code, object code, a code that represents an intermediate between source- and object-code, as in a partially compiled form, or in any other form appropriate to use upon the implementation of the present invention. The carrier may be any entity or device capable of carrying the program. For example, the carrier may comprise a storage medium such as a flash memory, a ROM (Read Only Memory), for example, a CD (Compact Disc) or a Semiconductor ROM, EPROM (Electrically Programmable ROM), EEPROM (Erasable EPROM), or a magnetic recordable medium, for example, a floppy or hard disk. In addition, the carrier may be an overloaded carrier such as an electrical or optical signal which can be passed through an electrical or optical cable or via radio or by other means. When the program is made up of a signal that can be directed directly by a cable or other device or member, the carrier may be such a cable, device or member. Alternatively, the carrier may be an integrated circuit in which the program is embedded, wherein the integrated circuit is adapted to perform, or to be used in carrying out the relevant processes.

The invention is not limited to the embodiments described with reference to the figures but can be varied freely within the scope of the appended claims.

The term "includes/including" when used herein, this term is understood to refer to the presence of the specified features, integers, steps or components. However, the term does not exclude the presence or addition of one or more additional features, integers, steps or components, or groups thereof.

What is claimed is:

1. A system for remote locating earth fault in a multi-phase power grid powered by a power source, the system comprising:

an alternating voltage source synchronized with the power grid, and which is connected between a zero point of the power grid and earth, a control unit configured to control the alternating voltage source in a fault current compensation mode to compensate for any ground fault current in the power network to a value below a threshold level, and at least one detector arranged in the power grid and communicatively connected to the control unit, which at least one detector is configured to register measurement values representing zero-sequence current and zero-sequence admittance, wherein said at least one detector is also configured to register measurement values to be applied by said control unit to determine an earth fault impedance $R_F$ and a corresponding delta angle step X;

the system further comprises at least one remote detector arranged in the power grid, and not communicatively connected to the control unit, wherein each at least one remote detector has a unique current pattern identity;

the control unit, when in a remote earth fault detection mode, is configured to adjust a voltage from the alternating voltage source with respect to the determined earth fault impedance $R_F$ and a corresponding delta angle step X to generate a zero-sequence current pattern based upon said impedance and said delta angle step X, wherein each at least one remote detector is configured to identify a zero-sequence current pattern, and to determine which remote detector has a unique current pattern identity that corresponds to the identified current pattern.

2. The system according to claim 1, wherein said determined remote detector is then configured to disconnect a faulty section associated to the determined remote detector, by applying a breaker associated to said remote detector.

3. The system according to claim 2, wherein after disconnection of a faulty section, the control unit is configured to control a zero-point reactor to retune in order to match the adjusted network size and to continue said fault current compensation mode to compensate for any ground fault current in the power network to a value below a threshold level.

4. A method to be applied by a system for remote locating earth fault in a multi-phase power grid powered by a power source, the system comprising:

an alternating voltage source synchronized with the power grid, and which is connected between a zero point of the power grid and earth, and a control unit configured to control the alternating voltage source in a fault current compensation mode to compensate for any ground fault current in the power network to a value below a threshold level, at least one detector arranged in the power grid and communicatively connected to the control unit, which at least one detector is configured to register measurement values representing zero-sequence current and zero-sequence admittance, wherein the system further comprises at least one remote detector arranged in the power grid not communicatively connected to the control unit wherein each at least one remote detector has a unique current pattern identity; wherein the method comprises:

registering, by said at least one detector, measurement values to be applied by said control unit to determine an earth fault impedance $R_F$ and a corresponding delta angle step X;

adjusting, by the control unit, when in a remote earth fault detection mode, a voltage from the alternating voltage source with respect to the determined earth fault impedance $R_F$ and a corresponding delta angle step X;

generating a zero-sequence current pattern, based upon said impedance and said delta angle step X;

identifying, by each at least one detector, a zero-sequence current pattern, and determining which remote detector has a unique current pattern identity that corresponds to the identified current pattern.

5. The method according to claim 4, wherein the method further comprises disconnecting, by said determined remote detector, a faulty section associated to the determined remote detector, by applying a breaker associated to said remote detector.

6. The method according to claim 5, wherein after disconnection of a faulty section, the method further comprises:

controlling, by the control unit, a zero-point reactor to retune in order to match the adjusted network size, and continuing said fault current compensation mode to compensate for any ground fault current in the power network to a value below a threshold level.

7. A computer program loadable into the memory of at least one processor, including software for executing the method according to claim 4, when the program is running in the at least one processor.

8. A processor-readable medium having a program stored therein, wherein the program is arranged to cause at least one processor to execute the method of claim 4, when the program is loaded into the at least one processor.

* * * * *